United States Patent
Efferenn et al.

(10) Patent No.: US 7,261,829 B2
(45) Date of Patent: Aug. 28, 2007

(54) METHOD FOR MASKING A RECESS IN A STRUCTURE HAVING A HIGH ASPECT RATIO

(75) Inventors: Dirk Efferenn, Dresden (DE); Hans-Peter Moll, Dresden (DE)

(73) Assignee: Infineon Technologies AG, Munich (DE)

( * ) Notice: Subject to any disclaimer, the term of this patent is extended or adjusted under 35 U.S.C. 154(b) by 108 days.

(21) Appl. No.: 10/501,464

(22) PCT Filed: Jan. 8, 2003

(86) PCT No.: PCT/EP03/00087

§ 371 (c)(1),
(2), (4) Date: Apr. 8, 2005

(87) PCT Pub. No.: WO03/060966

PCT Pub. Date: Jul. 24, 2003

(65) Prior Publication Data

US 2005/0224451 A1    Oct. 13, 2005

(30) Foreign Application Priority Data

Jan. 15, 2002    (DE) ................................ 102 01 178

(51) Int. Cl.
*B44C 21/00*    (2006.01)
*H01L 21/00*    (2006.01)

(52) U.S. Cl. ............................. 216/38; 216/17; 216/18; 216/58; 216/67; 438/689; 438/719

(58) Field of Classification Search ................. 216/13, 216/17, 18, 58, 67, 38; 438/689, 719
See application file for complete search history.

(56) References Cited

U.S. PATENT DOCUMENTS

| | | | |
|---|---|---|---|
| 5,001,079 A | 3/1991 | Van Laarhoven et al. |
| 5,728,631 A | 3/1998 | Wang |
| 5,741,740 A | 4/1998 | Jang et al. |
| 5,837,618 A | 11/1998 | Avanzino et al. |
| 6,022,802 A | 2/2000 | Jang |
| 6,140,207 A | 10/2000 | Lee |
| 6,204,200 B1 | 3/2001 | Shieh et al. |
| 2001/0006839 A1 | 7/2001 | Yeo |
| 2001/0046777 A1 | 11/2001 | Kim et al. |

FOREIGN PATENT DOCUMENTS

| | | |
|---|---|---|
| DE | 199 59 966 | 6/2001 |
| JP | 63-281441 | 11/1988 |

*Primary Examiner*—Shamim Ahmed
(74) *Attorney, Agent, or Firm*—Patterson & Sheridan, L.L.P.

(57) ABSTRACT

A method for selective masking is described. In this case, a filling material is applied to a structure which, as a function of the aspect ratio of the structure, forms cavities when the aspect ratio is high. The filling layer is then removed as far as the cavities and, using an etching process, filling material is removed completely from the recesses in which the cavities are formed. In this way, areas are exposed selectively.

9 Claims, 2 Drawing Sheets

METHOD FOR MASKING A RECESS IN A STRUCTURE HAVING A HIGH ASPECT RATIO

Figure 1:
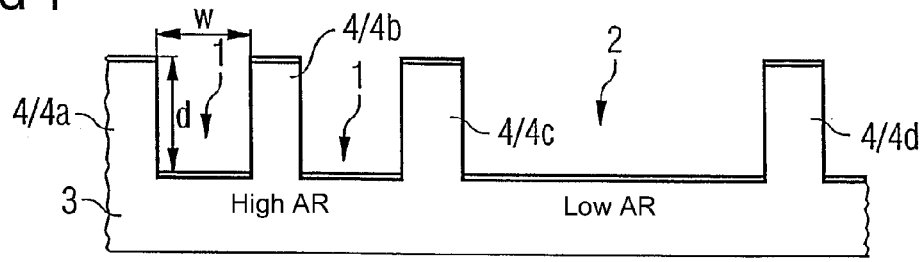

The invention relates to a method for masking a recess in a structure, in particular a semiconductor structure, having a high aspect ratio.

Masking of recesses is an essential process, in particular in semiconductor technology, and is used to select areas and to process them further independently of areas which are not selected. Normally, photoresists are used for selection of areas and are applied to a semiconductor wafer, the photoresists are then chemically changed in selected areas by means of structured exposure to light, so that the photoresist layer can be removed in the selected areas while it is not removed in the areas which are not selected. The surface of the semiconductor wafer is thus exposed in the selected areas for further processes, for example the application of a layer or ionization of the selected area.

The known method has the disadvantage, however, that it is necessary to adjust an exposure mask in order to expose the photoresist to light in the selected areas. This is relatively complex, especially when the dimensions are small, for example when producing a dynamic semiconductor memory.

The object of the invention is to provide a method which is self-adjusting for masking a recess in a structure having a high aspect ratio.

The object of the invention is achieved by the features of claim 1.

Further advantageous embodiments of the invention are specified in the dependent claims.

One major advantage of the invention is that cavity formation, which occurs owing to the high aspect ratio, is used to selectively choose the recess having the high aspect ratio. The geometric shape of the structure is thus used directly so that there is no need for specific adjustment of the mask. The method according to the invention can therefore be carried out easily.

An isotropic etching method is preferably used as the etching method.

A further improvement in the method is achieved by applying a sacrificial layer to the surface of the structure. The sacrificial layer further increases the aspect ratio of the structure. It is thus even possible to mask structures whose natural aspect ratio does not allow selection. This extends the field of application of the method according to the invention.

A filling layer is preferably removed to a defined distance from the surface of the structure. This ensures that areas which are located outside the selected area are not adversely affected by a subsequent etching process. The filling layer is therefore not etched away below the level of the structures in the areas which are not selected.

Experiments have shown that the defined distance is preferably greater than twice the maximum thickness of the filling material formed between a cavity and an adjacent structure. This ensures that filling material is removed completely in the selected recess during the subsequent etching process and, furthermore, that there is no adverse effect on the filling material in areas which are not selected.

The invention can be used for a large number of structures. However, one preferred field of application is use for semiconductor structures, in particular for structures which are formed from a silicon material.

A silicon oxide layer is preferably applied as the filling material, and is deposited using a TEOS process. The use of the TEOS process allows cavities to be formed reliably between structures which have more than a specific aspect ratio.

Silicon oxide is preferably deposited as the sacrificial layer. The use of silicon oxide offers the advantage that silicon oxide can be deposited easily and can be removed reliably and selectively after the deposition process.

Figure 2:
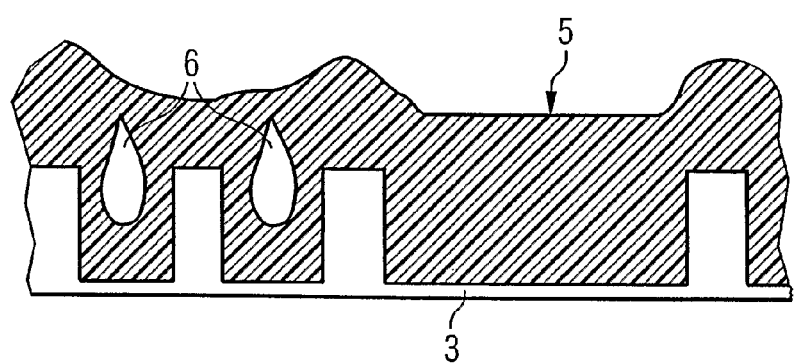
Figure 3:
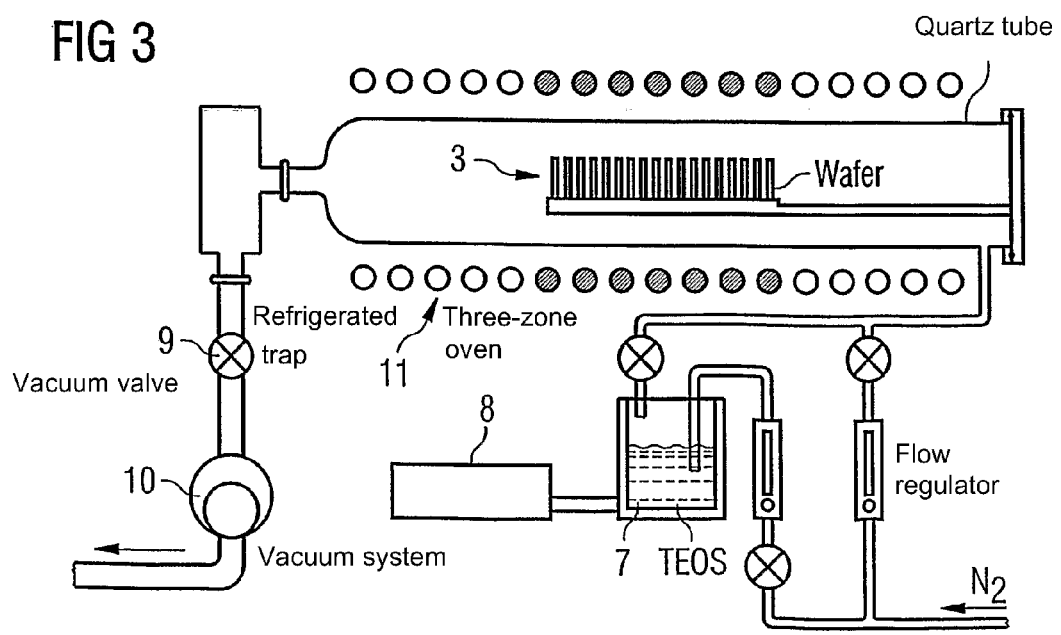
Figure 4:
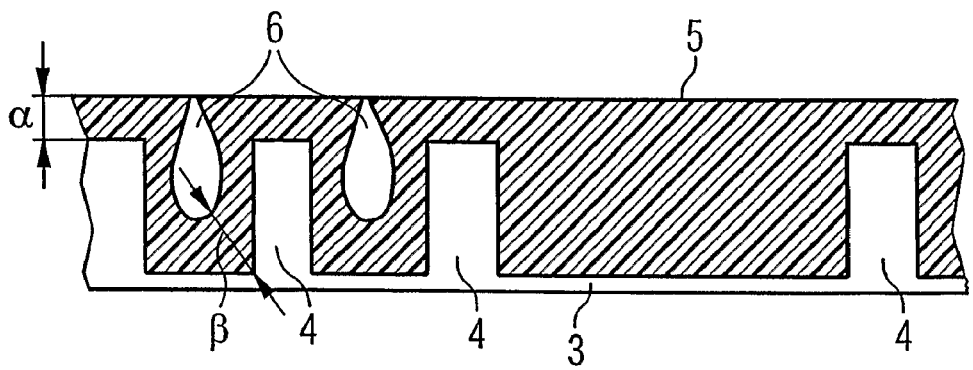
Figure 5:
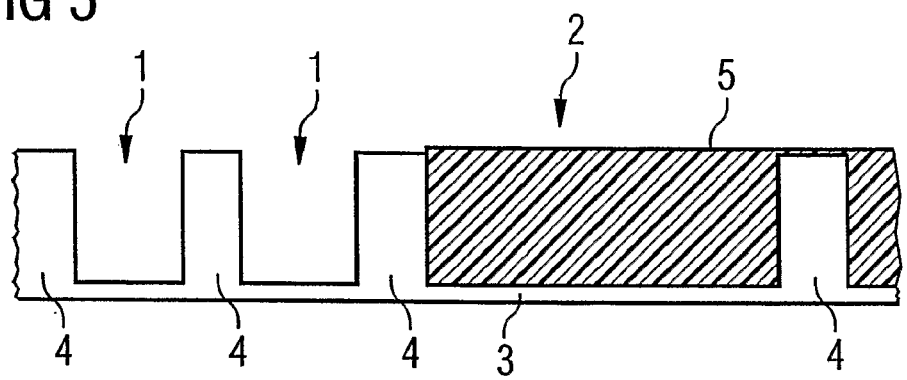
Figure 6:
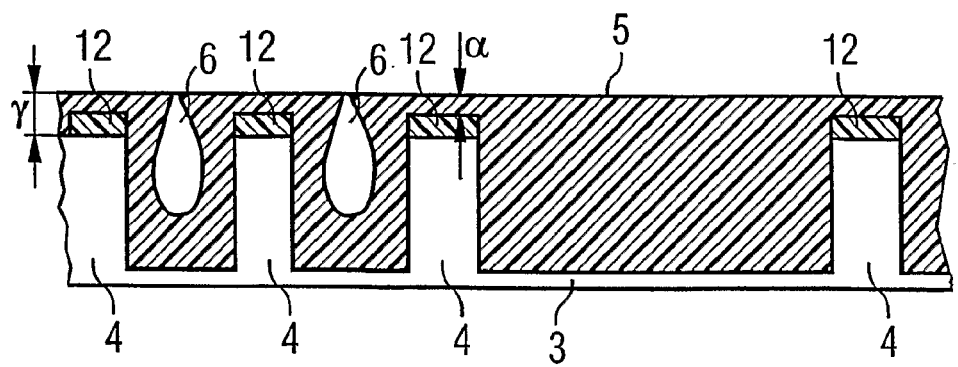

The invention will be explained in more detail in the following text with reference to the figures, in which:

FIG. 1 shows a schematic illustration of structures having a high aspect ratio and a low aspect ratio, FIG. 2 shows a filled structure with cavities, FIG. 3 shows an arrangement for depositing a filling layer, FIG. 4 shows a structure with a cavity and a partially removed filling layer, FIG. 5 shows a mask for selected areas, and FIG. 6 shows a structure with a sacrificial layer.

The invention will be explained in the following text with reference to the example of a structure in the form of a silicon material. The method according to the invention may, however, be applied to any type of structure which allows the deposition of the materials used and the application of the processes used. In particular, the method according to the invention can be used for semiconductor materials, such as gallium arsenide.

FIG. 1 shows, schematically, a partial detail of a structure which, by way of example, has been produced from a silicon wafer 3. The structure has a first area with webs 4 and first recesses 1, which have a high aspect ratio. The structure furthermore has a second area with webs 4 and a second recess 2, which have a low aspect ratio. The aspect ratio is defined by the width W with respect to the depth T of the recess. In the illustrated exemplary embodiment, the structure has four webs 4 of equal height, although the distance between a first and a second web 4a, 4b and between the second and a third web 4b, 4c is the same and is less than the distance between the third web 4c and a fourth web 4d.

Instead of the illustrated structure 4, webs of different height and/or webs of different width may also be used. The essential feature in this case is that first recesses 1 with a high aspect ratio and second recesses 2 with a low aspect ratio are formed. The webs 4 are formed from a silicon wafer 3, for example using an etching method. Furthermore, it is also possible for both the webs 4 and a plate from which the webs 4 project to be formed from different materials. For example, the webs 4 may also be formed from a different material on a silicon wafer. By way of example, the webs 4 may be produced from silicon oxide or silicon nitride, or else from a metallic alloy.

FIG. 2 shows the silicon wafer 3 after the deposition of a filling layer 5, which is represented in the illustrated exemplary embodiment by a silicon oxide which has been deposited using a TEOS process.

Instead of silicon oxide, any other type of material can be deposited which results in the formation of cavities when a specific aspect ratio is exceeded, and which can be removed again in a subsequent process. The deposition process is defined in such a way that cavities 6 are formed in the first recesses 1, which have a high aspect ratio. In the illustrated exemplary embodiment, a cavity 6 is formed in each first recess 1. However, the deposition process can also be used in such a way that a number of cavities 6 are formed in a first recess 1. The important feature in this case is that no cavity is formed in the second recess 2, which has a lower aspect ratio. The formation of cavities 6 depends on the aspect ratio of the filled structure. The filling material used and the deposition process used can be matched to the existing aspect ratios of the structure such that cavities 6 are produced in desired recesses 1.

The TEOS process which is used offers the advantage that the edge structure of the present structure, on which the TEOS material is deposited, likewise, to a certain extent, models the edge structure. In this way, cavities 6 are formed in structures having a high aspect ratio which is greater than a defined value. The defined value depends on the deposition process that is used.

FIG. 3 shows a schematic illustration of an apparatus for depositing a layer using a TEOS process. An organic liquid is used as the silicon source during the deposition process. The oxide which is produced from the vapour of the liquid is highly electrically stable in addition to providing conformal step coverage. During the deposition process, silicon oxide is deposited in accordance with the following formula:

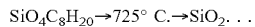

$$SiO_4C_8H_{20} \rightarrow 725° C. \rightarrow SiO_2 \ldots$$

Other liquid sources for silicon oxide deposition are diethylsilane, ditertiary butylsilane and tetramethyl-cyclotetrasiloxane. These liquid sources allow the deposition temperature to be reduced to 380 to 650° C. FIG. 3 shows, schematically, a quartz tube in which a large number of silicon wafers 3 are arranged. The quartz tube is connected via a line to a gas area which is formed above a liquid gas source 7. The liquid gas source 7 is kept at a defined temperature by a heat source 8. Furthermore, both the liquid gas and the quartz tube are supplied with nitrogen oxide. In addition, the quartz tube is connected to a vacuum pumping system 10 via a vacuum valve 9. The vacuum pumping system ensures that there is a defined pressure in the quartz tube. The quartz tube is surrounded by a three-zone oven 11, which also ensures that there is a defined temperature in the quartz tube. The deposition of TEOS silicon is a known method, so that the details will not be described here. The TEOS process is, for example, described in Section 7.1.2.2 "Low Pressure CVD-Verfahren" [Low pressure CVD processes] of "Siliziumhalbleitertechnologie" [Silicon semiconductor technology] Hilleringmann, Teubner, 1999, ISBN 3-519-10149-1. A major feature of the deposition process that is used is that the cavities 6 extend as far as an area which is located above the upper edge of the webs 4.

In a further method step, the filling layer 5 must be removed in a planar manner as far as the area of the cavities 6. The filling layer 5 is preferably removed until the cavities 6 are opened. However, depending on the application, it may be advantageous to allow a certain residual thickness to remain above the cavities 6.

When using a planar removal process, the filling layer 5 is removed, for example, by means of a chemical, mechanical polishing method. The filling layer 5 is preferably removed to a distance α with respect to the upper edge of the webs 4. The distance α is preferably chosen such that α is greater than or equal to twice the maximum distance β between a cavity boundary and the surrounding structure. FIG. 3 shows the distance β between one surface of a cavity 6 and a corner area between a web 4 and the plate of the silicon wafer 3. The choice of the defined distance ensures that the filling material 5 is completely removed from the first recesses 1 during the subsequent etching process without etching underneath the webs 4, which bound the second recess 2, at the sides.

The filling layer 5 is then etched away in a subsequent method step, by means of an etching method, preferably an anisotropic etching method. In the process, the etching solution which is used, such as alkali lyes or dry etching methods such as plasma etching, attacks in the area of the cavity 6 and etches the filling layer 5 out of the first recesses 1. At the same time, the etching solution also attacks the upper face of the filling layer 5 in the area of the second recess 2. However, only the surface of the filling layer 5 is etched away owing to the distance which is chosen. The distance a was chosen such that no etching underneath the webs occurs in the area of the second recesses 2. The etching process is stopped when the filling layer 5 has been removed from the first recess 1.

After the removal of the filling layer 5 from the first recesses 1, an arrangement is obtained as is illustrated in FIG. 5.

The method according to the invention results in the surfaces which are arranged in the first recesses 1 being exposed. Surfaces of other recesses, such as the second recess 2, are still covered by the filling layer 5. The filling layer 5 thus forms a covering mask for areas of the semiconductor wafer 3 which are not selected.

The exposed areas, in this case the first recesses 1, can be used in the rest of the method for, for example, implantation, for further etching, or for selective growth of a material such as silicon, silicon oxide or silicon nitride.

Owing to the method according to the invention, there is no need to use an adjustment process for an etching mask. The mask is adjusted on the basis of the use of the geometry of the structure and cavity formation during the deposition process that is used, without any adjustment being required.

FIG. 6 shows a further development of the method according to the invention, in which a sacrificial layer 12 is applied in a defined thickness γ on the webs 4. The sacrificial layer 12 may, for example, be in the form of silicon oxide or silicon nitride. The structure is not filled with the filling layer 5 until the sacrificial layer 12 has been applied. The sacrificial layer 12 offers the advantage that the height of the webs 4 is increased, so that the aspect ratio becomes higher. The aspect ratio can thus be set in such a way that the cavities 6 are formed in the desired way in the first recesses 1. The further processes such as removal of the filling layer 5 are carried out in accordance with the method described above.

FIG. 6 shows the structure with a sacrificial layer 12, in which the filling layer 5 has already been removed once again as far as the cavities 6. The formation of the sacrificial layer 12 preferably makes it possible to remove the filling layer 5 as far as the upper side of the sacrificial layer 12. It is thus simple to control the removal process, since the depth of the filling layer 5 which is removed is governed by the height of the sacrificial layer 12. In this embodiment as well, it is advantageous for there to be a distance between the upper edge of the sacrificial layer 12 and an upper edge of the removed sacrificial layer 12, as is shown in FIG. 6. The distance α can be selected in this way: $\alpha \geq 2\beta - \gamma$, where β denotes the maximum distance between a cavity boundary of a cavity 6 and the structure of the silicon wafer 3 or of a web 4, and γ denotes the height of the sacrificial layer 12. At the end of the process, the sacrificial layer 12 is removed once again, for example using a selective etching method.

What is claimed is:

1. Method for masking first recesses (1) in a structure (4) having webs (4) with a high aspect ratio, comprising a set of recesses (1, 2) having different aspect ratios, in particular a semiconductor structure, having the following steps:

a filling layer (5) is applied to the structure (1, 2, 4), with the filling layer (5) being applied over a fixed distance beyond the webs (4) in such a way that a cavity (6) is formed in first recesses (1) having a high aspect ratio, the filling layer (5) is removed by means of a planar removal process into the area of the cavity (6) with the filling layer (5) being removed to a defined distance above the surface of the webs (4), the filling layer (5) is removed in an etching process, with the etching process also attacking in the cavity (6) and, owing to the cavity (6), the filling layer (5) being removed more quickly from the first recess (1) than from recesses (2) without a cavity (6), and with the etching process being stopped after removal of the filling layer (5) from the first recess (1), with the defined distance being chosen such that the webs (4) are not underetched in the area of a recess (2) with a low aspect ratio during the etching process.

2. Method according to claim 1, characterized in that an isotropic etching method is used as the etching method.

3. Method according to one of claims 1 or 2, characterized in that the structure (1, 2, 4) has webs (4), and in that a sacrificial layer (12) is applied to the surface of the webs (4), before the application of the filling layer (5).

4. Method according to one of claims 1 to 3, characterized in that a chemical/mechanical polishing method is used as the planar removal process.

5. Method according to claim 4, characterized in that the defined distance is chosen to be greater than twice the maximum thickness ($\beta$) of the filling material (5) between a cavity (6) and the structure (4, 3).

6. Method according to one of claims 1 to 5, characterized in that the structure (1, 2, 4) is formed from a silicon wafer (3).

7. Method according to one of claims 1 to 6, characterized in that silicon oxide is deposited as the filling layer (5), using a TEOS process.

8. Method according to one of claims 1 to 7, characterized in that silicon oxide is deposited as the sacrificial layer (12).

9. Method according to one of claims 1 to 8, characterized in that the filling layer (5) is applied over a recess (2) with a low aspect ratio to above the height of the cavity (6).

* * * * *